(12) United States Patent
Nayak et al.

(10) Patent No.: US 7,362,116 B1
(45) Date of Patent: Apr. 22, 2008

(54) METHOD FOR PROBING IMPACT SENSITIVE AND THIN LAYERED SUBSTRATE

(75) Inventors: Uday Nayak, San Jose, CA (US); Sun Ya Lei, Singapore (SG); Lynn Howard Whitney, Lakehead, CA (US)

(73) Assignee: Electroglas, Inc., San Jose, CA (US)

( * ) Notice: Subject to any disclaimer, the term of this patent is extended or adjusted under 35 U.S.C. 154(b) by 43 days.

(21) Appl. No.: 11/271,416

(22) Filed: Nov. 9, 2005

(51) Int. Cl.
*G01R 31/02* (2006.01)

(52) U.S. Cl. ........................................ 324/756; 324/758

(58) Field of Classification Search ........ 324/754–762, 324/765, 158.1, 73.1; 702/117, 120; 439/482
See application file for complete search history.

(56) References Cited

U.S. PATENT DOCUMENTS

| | | | |
|---|---|---|---|
| 3,996,517 A * | 12/1976 | Fergason et al. | 324/754 |
| 5,436,571 A * | 7/1995 | Karasawa | 324/765 |
| 5,450,203 A | 9/1995 | Penkethman | |
| 5,631,856 A * | 5/1997 | Keller et al. | 716/4 |
| 5,654,204 A | 8/1997 | Anderson | |
| 5,657,394 A | 8/1997 | Schwartz et al. | |
| 5,961,728 A | 10/1999 | Kiser et al. | |
| 6,096,567 A | 8/2000 | Kaplan et al. | |
| 6,121,058 A | 9/2000 | Shell et al. | |
| 6,156,661 A | 12/2000 | Small | |
| 6,307,387 B1 | 10/2001 | Gleason et al. | |
| 6,320,372 B1 | 11/2001 | Keller | |
| 6,417,683 B1 | 7/2002 | Colby | |
| 6,507,207 B2 | 1/2003 | Nguyen | |
| 6,635,186 B1 | 10/2003 | Small et al. | |
| 6,777,966 B1 | 8/2004 | Humphrey et al. | |
| 6,838,893 B2 | 1/2005 | Khandros, Jr. et al. | |
| 6,857,159 B1 | 2/2005 | Strine | |
| 6,911,814 B2 | 6/2005 | Miller et al. | |
| 6,919,732 B2 | 7/2005 | Yoshida et al. | |
| 6,921,466 B2 | 7/2005 | Hongo et al. | |
| 7,119,566 B2 * | 10/2006 | Kim | 324/758 |

FOREIGN PATENT DOCUMENTS

JP         63-257240         * 10/1988

* cited by examiner

*Primary Examiner*—Vinh P. Nguyen
(74) *Attorney, Agent, or Firm*—Blakely, Sokoloff, Taylor & Zafman LLP

(57) ABSTRACT

A method of moving a substrate to a probe card. The method includes moving a probe card and a substrate vertically closer to one another employing dynamically changing velocities during the moving. More than two different velocities are used during the moving. The velocities are at zero only at an initial location and a final location. The moving is such that the probe card and the substrate contact each other with a soft impact. The velocities for the moving begin with a high velocity and reduce to a lower velocity so that the contact between the probe card and the substrate has a microtouch impact.

16 Claims, 7 Drawing Sheets

METHOD FOR PROBING IMPACT SENSITIVE AND THIN LAYERED SUBSTRATE

FIELD

The present invention relates generally to semiconductor processing and more particularly to a probe card system and a method for probing impact sensitive and thin-layered substrates.

BACKGROUND

Integrated circuits are often manufactured on a semiconductor substrate, such as a silicon wafer. The silicon wafer is typically a thin circular plate of silicon that is 150, 200 or 300 millimeters in diameter and approximately 25 mils thick. A single wafer will have numerous devices which are integrated circuits and are imprinted on the wafer comprising a lattice of devices. Each device consists of numerous layers of circuitry and a collection of bonding pads. The bonding pads are small sites, typically 3 mils square, made usually with aluminum (or other conductive material) that eventually serves as the device's connections to the pin leads. Other than the bonding pads, the remainder of the wafer is coated with a final layer of an insulating material such as silicon nitride, called the passivation layer, which in many respects behaves like glass. The aluminum itself forms a thin non-conductive layer of aluminum oxide, which must be eliminated or broken through before good electrical contact can be made.

Since the packaging of a device is somewhat expensive, it is desirable to test a device before packaging to avoid packaging bad devices. This process of testing devices before packaging is referred to as the sort process. This process involves connecting a device called a probe card to a special tester. The probe card has a collection of electrical contacts or pins (also referred to as probe elements) that stands in for the normal pins and wire leads of a packaged device. The wafer is then positioned so that the contacts or pins on the probe card make contact with a given device's bonding pads and the tester runs a battery of electrical tests on the device. A special machine, called a wafer prober, is used to position each device on the wafer with respect to the probe card. High accuracy is required, because the bonding pads are small and if a probe card pin makes contact outside the bonding pad area, the result may be a break in the passivation layer, which generally results in a damaged device. Also, the card pins need to be cleaned to ensure accuracy of such contact.

A primary purpose of wafer probing is to accurately position the collection of devices, or dice, on a wafer in such a manner so that the device's bonding pads make good electrical contact with a probe card's probe pins so that the device may be properly tested before dicing and packaging. Inaccuracy positioning may cause damages to either the probe pins or the bonding pads, and/or other components of the probe card and the devices on the substrate.

Types of damages that may occur include gouging of the bonding pads so as to expose the metal layer underneath and cracking of the pads thereby damaging the active components below. Other damages include damages to the probe pins such as bending and breaking. To avoid damages such as damages to the bonding pads, the motions of the probe system are controlled so as to achieve a "softer" (e.g., slower and less forceful) contact between the probe pins and the bonding pads. In one current method, the substrate is moved up to a specific height of contact, stopped, and the motion of moving the substrate is changed. The motion is slowed down so that the substrate can be moved closer to the probe pins with a reduced motion. In that way, the contact between the bonding pads and the probe pins is softer or slower. Such change of motion substantially impacts the probe system's throughput.

It is desirable to provide a probe card cleaning device and method, which overcomes the above limitations and drawbacks of the conventional testing devices.

SUMMARY

Embodiments of the present invention provide improved methods for moving a probe card toward a substrate in a probe system for a particular procedure.

In one aspect, the invention pertains to a method of moving a substrate to a probe card. The method comprises moving a probe card and a substrate vertically closer to one another employing dynamically changing velocities during the moving. More than two different velocities are used during the moving. The velocities are at zero only at an initial location and a final location. The moving is such that the probe card and the substrate contact each other with a soft impact. The velocities for the moving begin with a high velocity and reduce to a lower velocity so that the contact between the probe card and the substrate use a microtouch impact.

In another aspect, the invention pertains to a method which comprises placing a substrate on a substrate supporter provided in a probe system. The substrate supporter is moveable in XYZ directions. Next, a probe card coupled to a probe chuck of the probe system is provided. The probe card has at least one probe pin configured to perform a procedure on the substrate. The probe card is also moveable in XYZ directions. Next, the probe chuck and the substrate supporter are moved in the Z-direction toward one another using dynamically changing velocities. During the moving, a plurality of different velocities are used and the velocities are at zero only at an initial location and a final location of the probe card and the substrate. The method further includes moving the probe card and/or the substrate in the Z-direction a fast velocity before the probe card and the substrate contact each other and at a slow velocity as the probe card and the substrate contact each other producing a microtouch impact.

In another aspect, the invention pertains to a method which comprises obtaining a first characteristic associated with a substrate loaded on a substrate supporter and a second characteristic associated with a probe card loaded on a probe card supporter. Next, determine a set of velocities and a sequence of velocities for moving the substrate supporter and the probe card supporter toward each other based on the first characteristic and the second characteristic to cause a contact between the probe card and the substrate. The velocities including one or more fast velocities and one or more slower velocities with respect to the fast velocities. The velocities provides for a fast moving of the probe card and/or the substrate toward each other and a slow moving of the probe card and/or the substrate into contact with a microtouch impact between the probe card and said substrate. Next, execute a series of motions to carry out the moving.

More details of the embodiments of the present invention are followed.

BRIEF DESCRIPTION OF THE DRAWINGS

The invention will be understood more fully from the detailed description given below and from the accompanying drawings of various embodiments of the invention, which, however, should not be taken to limit the invention to the specific embodiments, but are for explanation and understanding only. In the drawings.

DETAILED DESCRIPTION

In the following description, for purposes of explanation, numerous specific details are set forth in order to provide a thorough understanding of the invention. It will be apparent t one skilled in the art, however, that the invention can be practiced without these specific details. In other instances, structures and devices are shown in block diagram form to avoid obscuring the invention.

Prior to describing exemplary methods of the present invention that pertain to moving a probe card and a substrate closer to and contact each other with a microtouch impact a short description of an exemplary probe system is provided. An exemplary probe system that can benefit from embodiments of the present invention is described below. The probe system below is only an example of a probe system that can be used with the present invention. It is to be understood that other systems can also be used in conjunction with embodiments of the present invention and likewise benefit from the invention. Although the discussion of the exemplary embodiments focus mainly on a probe system, the embodiments are similarly applicable for other system where two surfaces (or components thereon) need to come into contact with each other with a microtouch impact, an impact where the surfaces or components contact each other smoothly and softly without an excessive force that may cause damages.

Figure 1:
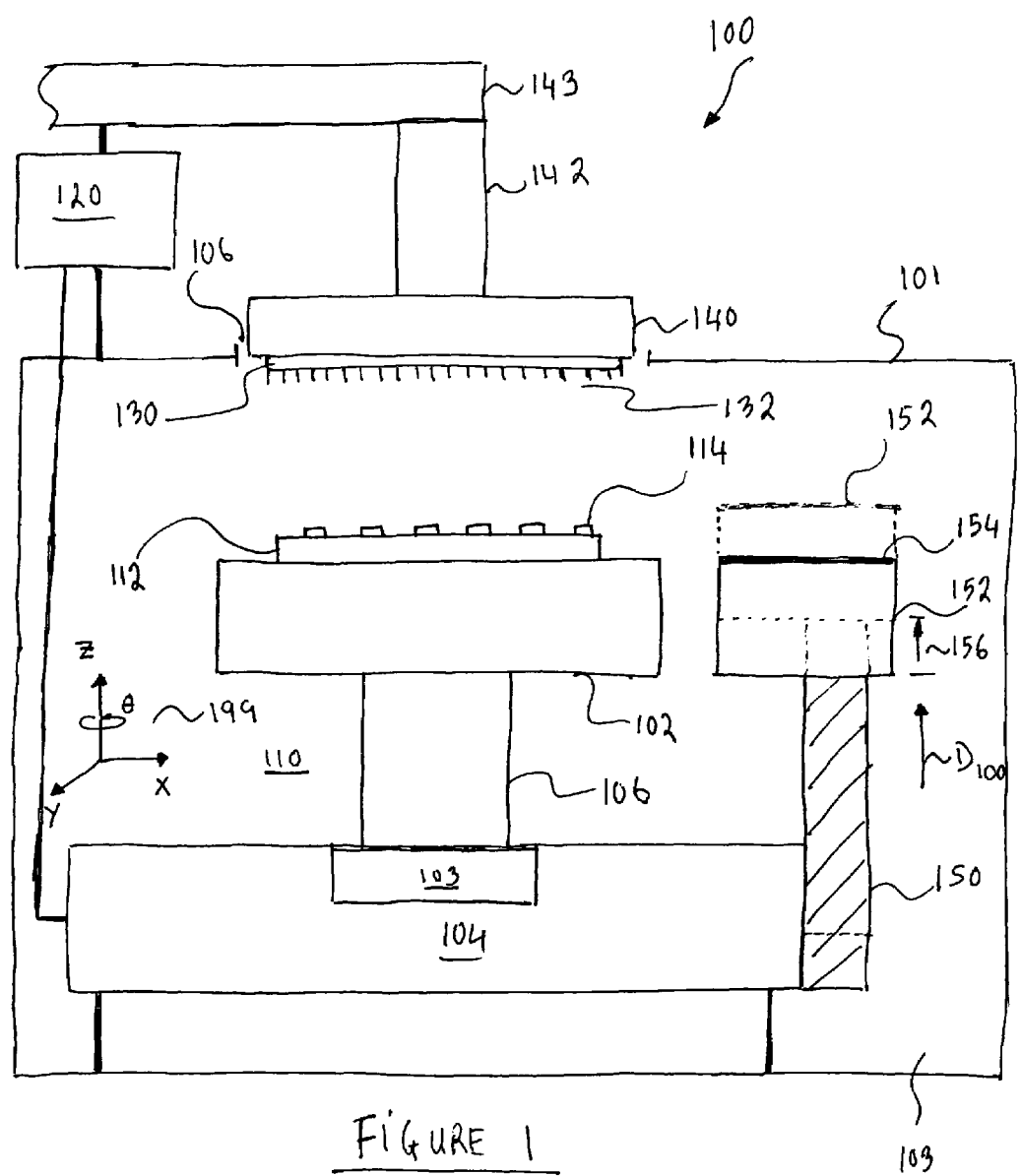
FIG. 1 illustrates an example wafer prober system.

FIG. 1 of the accompanying drawings illustrates a probe apparatus 100, according to an embodiment of the present invention, for an electrical testing of a substrate (e.g., a silicon wafer) having a plurality of terminals. The apparatus 100 includes a frame 101, a probe card 130, a substrate holder 102, a scrub device 152, and a translation device 110.

The frame 101 includes an opening 116 through which the probe card 130 is introduced into the frame 101. The frame 101 also can define a testing and cleaning chamber 103 for the apparatus 100. The chamber 103 can be set to a suitable condition (e.g., suitable temperature and pressure) for the testing and cleaning a wafer.

The probe card 130 is mounted to a probe card support structure 140, which is further mounted or extended from a probe card chuck 142. The chuck 142 actuates, manipulates, positions, or controls the position of the probe card 130. The chuck 142 can be connected to an arm 143 that is coupled to or is part of a motor that is used to move, actuate, manipulate, position, or align the probe card 130. The probe chuck 142 may be configured to provide movements of the probe card 130 in any of the X, Y, Z, and theta directions 199. In addition, the movements of the probe card 130 can also be controlled by a processing unit or a controller 120 provided with or coupled to the apparatus 100. The controller 120 is typically a computer or a machine having a processor (not shown) that can execute a program (a set of instructions) that controls all of the components of and steps associated with the apparatus 100. In one embodiment, a computer program product is stored in a machine-readable medium (not shown) or a memory storage medium that communicates with the controller 120 and is executed by the processor. In this embodiment, the program controls movements of the probe card supporter, the substrate supporter, a testing cycle, cleaning cycle, and other steps associated with the apparatus 100. User interactive devices such as keyboard, mouse, and display (not shown) can also be coupled to the controller 120 to allow for controlling of the apparatus 100.

The probe card 130 includes a plurality of probe elements, pins, or bars 132 extending from the bottom surface of the probe card 130. The elements 132 are contact electrodes which may include metallic pins. The probe elements 132 are also secured to the probe card 130. The probe card 130 is used for making electrical contact with terminals (contact pads) 114 on a substrate 112. The probe elements 132 are brought into contact with the terminals 114. An electrical tester (not shown) is connected to the probe elements 132 and the probe card 130. Electrical signals can be transmitted from the electrical tester thorough the probe elements and the terminals to the electrical circuits, or signals can be sent from the circuits through the terminals and probe elements to the electrical tester. The probe card 130 may be any of the different varieties of probe cards, including for example membrane probe cards.

The substrate holder 102 is mounted or supported by a wafer chuck 106 which is further coupled to a base 104. In one embodiment, the base 104 is located on a horizontal surface of the frame 103. The base 104 is configured to translate a force to the wafer chuck 106 to allow it to move in a vertical and/or horizontal direction. In one embodiment, wafer chuck 106 is moveably coupled to the base 104 in a manner which allows the wafer chuck 106 to be moved in the X, Y, Z, and theta directions 199. The base 104 can include a motor or an actuation mechanism 103 (known in the art) to move the wafer chuck 106 in the X, Y, Z, and theta directions.

The wafer chuck 106 also accepts the attachment of a substrate 112 via the substrate support 102. The substrate 112 is a semiconductor wafer having one or more electrical components (not shown) built or formed thereon or therein. Contact pads (terminals) 114 are provided on the substrate 112 for a testing purpose, in one embodiment.

The wafer chuck 106 and the base 104 can also be coupled to the controller 120 similar to previously described for the probe card support structure 140 and the probe card chuck 142. In addition, the movement of the wafer chuck 106, the base 104, as well as the substrate support 102 can also be controlled by the controller 120 coupled to the apparatus 100.

For a testing cycle, the probe card 130 is brought into contact with the substrate 112 such that the probe elements 132 make contact with the contact pads 114 on the substrate so that a particular electrical testing can take place. For instance, the elements 132 make contact with the pads 114 of the substrate 112 when the probe card 130 and the substrate 112 are properly aligned and brought sufficiently close to each other by the apparatus 100, for example, via the assistance of an operator and/or the controller 120. The pads 114 may comprise any contact electrode surface including, but not limited to a flat surface or a solder bump or pins or posts. The probe card 130 and the substrate 112 contact one another with a "microtouch" impact, in that the probe card 130 and the substrate 112 sufficiently contact each other to allow for the connection between the elements 132 and the pads 114 without too much force or too much impact that may cause damages to the probe elements 132, the pads 114, or other elements of the substrate 112 and/or the probe card 130. In according to embodiments of the present invention, the probe card 130 and the substrate 112 are brought into contact with a microtouch impact by using a set of velocities where only the initial velocity and the final velocity are at zero and the velocities during the moving are changing from fast to slow to prevent excessive impact. More details on controlling the velocities are described in more details below.

The alignment for the probe card 130 with respect to the substrate 112 can also be accomplished using a vision subsystem (not shown) incorporated into the apparatus 100 and positioned in the chamber 103. The vision subsystem of the apparatus 100 of the present embodiment may use two cameras, a wafer alignment camera (not shown) and a sensor camera (not shown). The wafer alignment camera, which may contain both coaxial and oblique illumination sources, is configured to view a substrate 112 on the wafer chuck 102. The vision subsystem is also configured to view a probe card 130 attached to the probe chuck 140.

While the system shown in FIG. 1 probes the wafer horizontally, it will be appreciated that the various aspects of the present invention may be used with vertical prober system in which the flat surface of the wafer is rotated 90-degree from the position shown in FIG. 1. Also, although the apparatus 100 shown in this figure illustrates only one probe card 130 and one substrate 112, it is to be understood that the apparatus 100 may very well include more than one of such components.

After a certain testing cycles, the probe elements 132 may need to be cleaned or otherwise treated. A scrub device 152 is provided for such cleaning or treating purpose. The scrub device 152 may be included within the chamber 103 as shown in FIG. 1. In one embodiment, the scrub device 152 is placed on scrub supporter 150 and can be moved in the X, Y, and Z direction 199. The scrub device 152 includes a scrub substrate or pad 154 placed on top of the scrub device 152. The scrub supporter 150 can be moved by the base 104 similarly to how the wafer chuck 106 is moved. A motor similar to the motor 103 may be included in the base 104 to move the scrub supporter 150. The scrub device 152 is aligned with the probe card 130 for cleaning. The scrub device 152 is moved vertically upward in the $D_{100}$ direction so that the scrub pad 154 is at a higher position than the substrate 112; for instance, the scrub device 152 is raised a distance 156 so as to place the scrub device 152 to be higher than the substrate 112. In one embodiment, a motor (not shown) is coupled to the scrub device 152 to move the scrub device 152 in the vertical direction (Z direction) so that the scrub pad 154 can be brought closer to the probe elements 132. The motor can also be configured to be able to rotate the scrub device 152 for a particular cleaning process. Alternatively, the motor that is used to control the probe card 130 can also be configured to rotate the probe card 130 for similar cleaning processes.

The scrub pad 154 can be made of various materials that can clean a probe element 132 of a probe card 130. In cleaning the probe element 132, the scrub pad 154 can scrub, clean, maintain, reshape, sharpen, or even modify the probe element 132 depending on a desired cleaning process. The scrub pad 154 may also have a predetermined mechanical or chemical characteristic such as abrasiveness, density, elasticity, tackiness, planarity, and chemical properties (acetic or basic).

Figure 3:
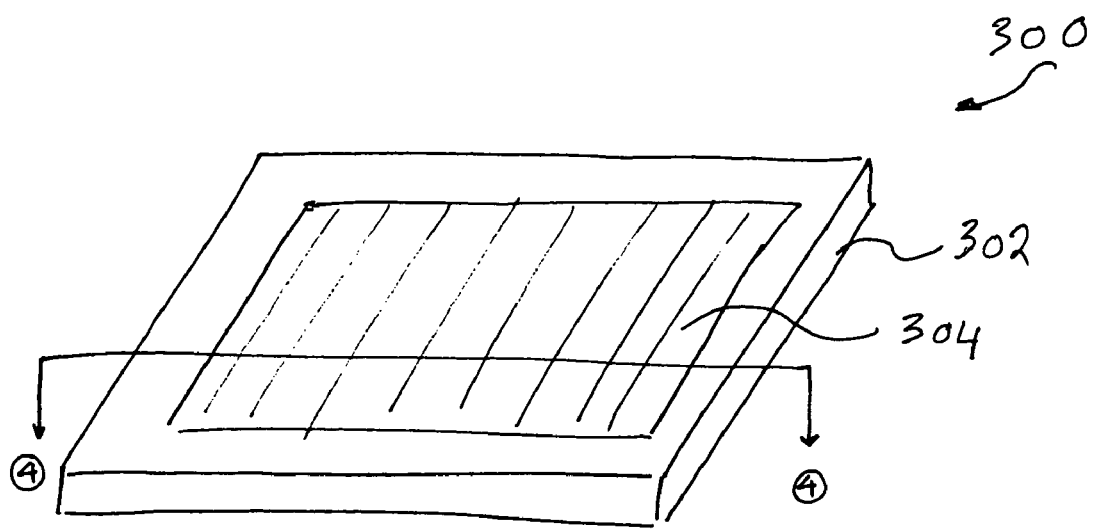
FIGS. 3-4 illustrate exemplary embodiment of a scrub pad that can be used with various embodiments of the present invention.
Figure 4:
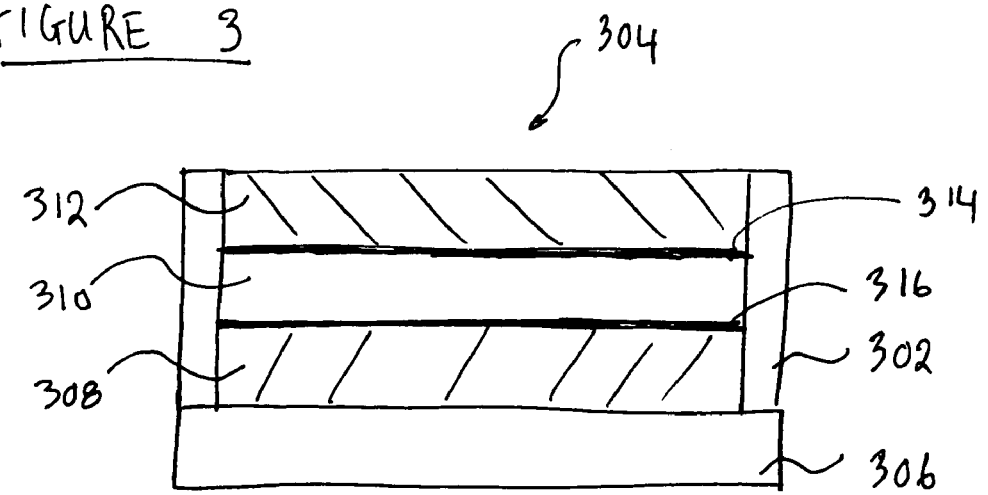

In one embodiment, the scrub pad 154 includes a chemical layer or layers or a gel-like material for a particular cleaning process. FIGS. 3-4 illustrate an exemplary scrub pad 300 that can be used for the scrub pad 154. In the present embodiment, the scrub pad 300 includes a frame 302 that surrounds a cleaning stack 304. The cleaning stack 304 includes one or more chemical layers or cells that may be acetic or basic which can oxidize, reduce, or clean contaminants, or which can induce a chemical reaction and/or a mechanical action that removes contaminants. FIG. 4 illustrates an exemplary cleaning stack 304 in more detail. The stack 304 includes a substrate 306, a layer 310 disposed on the layer 309, and a layer 312 disposed on the layer 310. Between each layer, there may be a seal layer 314 and 316. Each of the layers 308, 310, and 312 may be a chemical layer having a particular characteristic for a particular cleaning. The stack 304 may include a combination of layer that performs both chemical and mechanical cleaning for a probe element. The scrub pad 300 can include materials such as tungsten, ceramic, aluminum, stainless steel, gel pad, sand paper, etc. More details of the apparatus 100 can be found in a co-pending patent application entitled "Method and apparatus for cleaning a probe card," which has a Ser. No. 11/195,926, which is hereby incorporated by reference in its entirety.

Figure 2:
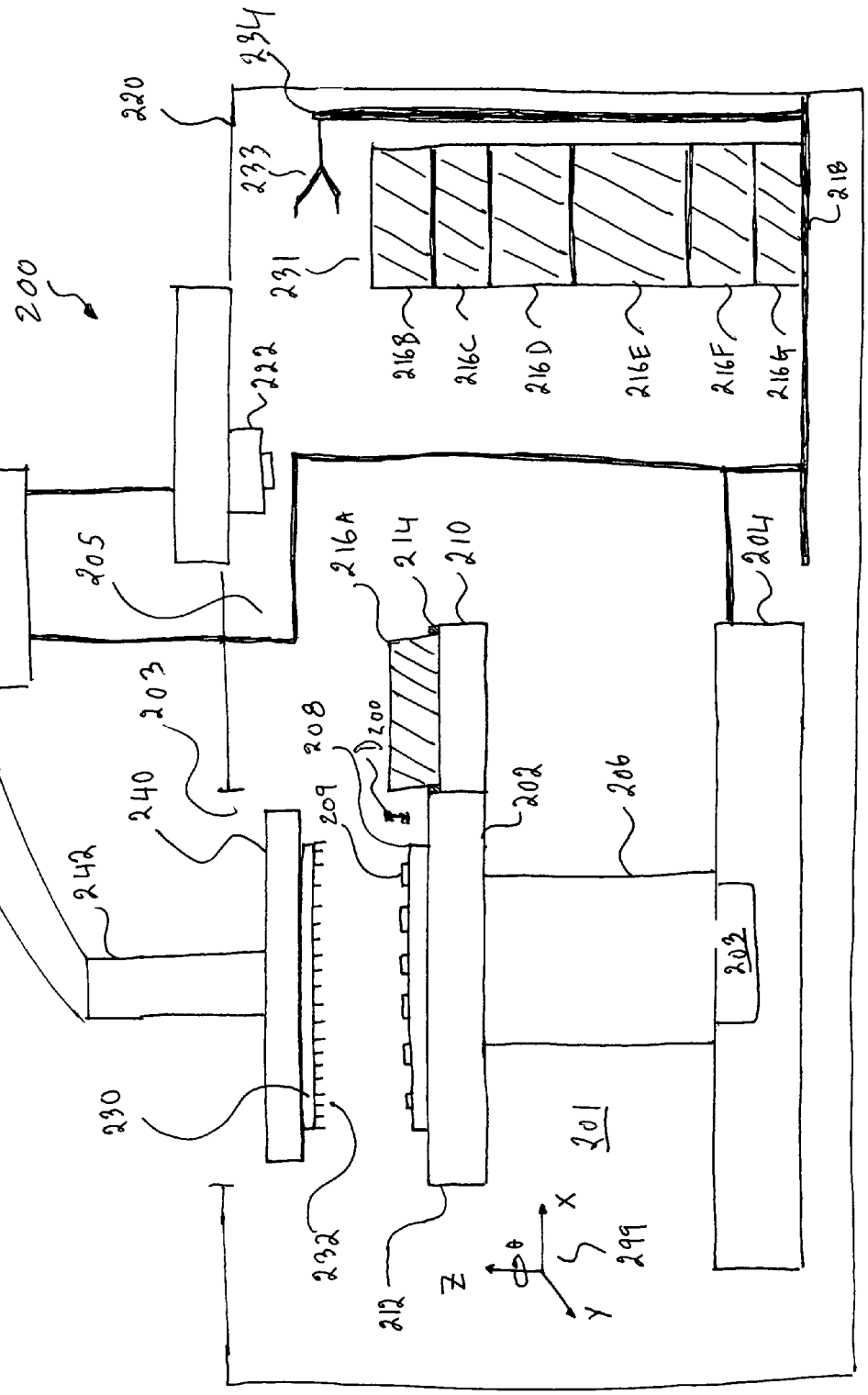
FIG. 2 illustrates another exemplary embodiment of a probe system.

FIG. 2 illustrates yet another exemplary probe apparatus 200 that can be used for or benefit from embodiments of the present invention. The apparatus 200 is similar to the apparatus 100 except that in the apparatus 200, the scrub device is attached to a platform that supports the substrate and that the apparatus 200 utilizes a mechanism that is used to move the substrate in alignment with the probe card for testing to move a scrub device in alignment with the probe card for cleaning the probe elements.

The apparatus 200 includes a frame 220, a probe card 230, a substrate holder or supporter 202, a scrub pad mounting plate/platform 210, and a translation device 201. The frame 220 includes an opening 203 through which the probe card 230 is introduced into the chamber 205 of the apparatus 200.

The probe card 230 is mounted to a probe card support structure 240, which is further mounted or extended from a probe card chuck 242. The chuck 242 actuates, manipulates, positions, or controls the position of the probe card 230. The chuck 242 can be connected to an arm that is coupled to or is part of a motor that is used to move, actuate, manipulate, position, or align the probe card 230. The probe chuck 242 may be configured to provide movement of the probe card 230 in any of the X, Y, Z, and theta directions 299. In addition, the movement of the probe card 230 can also be controlled by a processing unit or a controller 221 coupled to the apparatus 200 (similar to the controller 120 for the apparatus 100).

The probe card 230 includes a plurality of probe elements, pins, or bars 232 extending from the bottom surface of the probe card 230. The probe elements 232 are brought into contact with terminals 209 provided on a substrate 212 for a particular testing.

The substrate holder 212 is controlled by the translational device 201. In one embodiment, the substrate holder 212 is mounted to a platform 202 which is further supported by a wafer chuck 206 which is further coupled to a base 204. In one embodiment, the base 204 is located on a horizontal surface of the frame 220. The base 204 is configured to translate a force to the wafer chuck 206 to allow it to move in a vertical and/or horizontal direction. In one embodiment, wafer chuck 206 is moveably coupled to the base 204 in a manner which allows the wafer chuck 206 to be moved in the X, Y, Z, and theta directions 299. The base 204 can include a motor or an actuation mechanism 203 (known in the art) to move the wafer chuck in the X, Y, Z, and theta directions. Moving of the wafer chuck 206 translates respective movement to the platform 202 and the substrate holder 212.

The wafer chuck 206 also accepts the attachment of a substrate 208 via the substrate support 212. The substrate 208 is a semiconductor wafer having one or more electrical components (not shown) built or formed thereon or therein. Contact pads 209 are provided on the substrate 208 for a testing purpose, in one embodiment.

The wafer chuck 206 and the base 204 can also be coupled to the controller 221 similar to previously described for the probe card support structure 240 and the probe card chuck 242. In addition, the movement of the wafer chuck 206, the base 204, the platform 202, as well as the substrate support 202 can also be controlled by the controller 220 coupled to the apparatus 200.

The elements 232 make contact with the pads 209 of the substrate 208 when the probe card 230 and the substrate 208 are properly aligned by the apparatus 200, for example, via the assistance of an operator and/or the controller 221. The alignment can also be accomplished using a vision subsystem (not shown) incorporated into the apparatus 200 and positioned in the chamber 220. The vision subsystem of the apparatus 200 of the present embodiment may use two cameras: a wafer alignment camera (not shown) and a sensor camera (not shown). The wafer alignment camera, which may contain both coaxial and oblique illumination sources, is configured to view a substrate 208 on the substrate supporter 212. The vision subsystem is also configured to view a probe card 230 attached to the probe chuck 240.

The scrub pad mounting plate 210 is also controlled by the translational device 201. The scrub pad mounting plate 210 is mounted on the platform 202. In one embodiment, the scrub pad mounting plate 210 is coupled to the wafer chuck 206 (via the platform 202) so that the chuck 206 can move the scrub pad mounting plate 210 in the same way that the wafer chuck 206 moves the substrate supporter 212. In one embodiment, the scrub pad mounting plate 210 is attached to and adjacent to the substrate supporter 212. Thus, the same action that is used to move the substrate supporter 212 is used to move the scrub pad mounting plate 210. In the present embodiment, only one actuation mechanism is used to move both the substrate supporter 212 and the scrub pad mounting plate 210.

The scrub pad mounting plate 210 includes one or more coupling member or mounting member 214 for securing a scrub pad 216A to the scrub pad mounting plate 210. The mounting member 214 can have the form of a track where complimentary track on the scrub pad 216A can mount to and be secured thereto.

The scrub pad 216A and the scrub pad mounting plate 210 are dimensioned so that when the scrub pad 216A is mounted onto the scrub pad mounting plate 210, the scrub pad 216A is higher than the substrate 208 that is loaded on the substrate supporter 212. When mounted, the scrub pad 216A has a distance $D_{200}$ that is higher than the substrate 208 that is mounted on the substrate supporter 212. The wafer chuck 206 moves both the scrub pad mounting plate 210 and the scrub pad 216A using the same mechanism but with the scrub pad 216A being dimensioned to be sufficiently thick, when loaded, the scrub pad 216A is higher than the substrate 208 by the distance $D_{200}$. Thus, the same mechanism is used to raise the substrate supporter 212 and the scrub pad mounting plate 210 at the same time but with the scrub pad 216A ends up being higher than the substrate due to its thickness. The scrub pad 216A thus can be brought closer to the probe card for cleaning the probe elements without an additional actuation mechanism.

In one embodiment, the scrub pad mounting plate 210 is configured to allow loading/unloading of a new scrub pad. In one embodiment, the apparatus 200 includes a loading/unloading station 231 that holds one or more scrub pads 216A-216G. The station 231 can be a cassette system configured to store a plurality of scrub pads. The station 231 can also be a docking station with compartments or slots configured to hold a plurality of scrub pads. The loading/unloading station 231 can also be configured to load a scrub pad onto the scrub pad mounting plate 210. In one embodiment, the loading/unloading station 231 removes one scrub pad from the scrub pad mounting plate 210 and places another scrub pad onto the scrub pad mounting plate 210 (e.g., replacing a used scrub pad with a new scrub pad).

In one embodiment, the loading/unloading station 231 is configured to store a set of scrub pad 216A-216G of multiple scrub pad materials of same types of different types. A used scrub pad can be replaced by an unused pad at the loading/unloading station. The apparatus 200 can also load a different scrub pad depending on a particular cleaning process without shutting down the apparatus 200 for the replacement. In one embodiment, the loading/unloading station 231 is configured to store scrub pads of different sizes thus, the apparatus 200 can also conveniently load different size probe card and different size scrub pad accordingly without shutting down the apparatus 200 to replace the scrub pad.

The loading/unloading station 231 may be configured to identify the types of scrub pad being stored at the loading/unloading station 231. This ability enables cleaning cycle recipe or parameter changes depending on the identified characteristics of the particular scrub pad.

In one embodiment, the loading/unloading station 231 is mounted on a track 218 that allows for the station 231 to be moved around. A motor (not shown) may be coupled to the apparatus 200 to control the movement of the station 231. The controller 221 can also be coupled to the motor, the station 231, or the track 218 to execute the movement of the station 231. In one embodiment, the station 231 is moved closed to the scrub pad mounting plate 210 for the loading and unloading of a scrub pad. In other embodiments, the base 204 moves the platform 202 and the scrub pad mounting plate 210 over to the station 231 for the loading and unloading of a scrub pad.

In one embodiment, the apparatus 200 includes a robotic assembly 234 with a handle 233. The robotic assembly 234 may be coupled to the station 231 and configured to move together with the station 231. Upon command, the robotic assembly 234 (via the handle 233) moves a scrub pad from the station 231 and loads it onto the scrub pad mounting plate 210. Similarly, the robotic assembly 234 also removes a scrub pad form the scrub pad mounting plate 210, places it into the station 231 and optionally, loads another scrub pad onto the scrub pad mounting plate 210. In one embodiment, the robotic assembly includes a motor (not shown) that allows it to move closer to the scrub pad mounting plate 210 to load and unload a scrub pad. Thus, both the scrub pad mounting plate 210 and the loading/unloading station 231 need not be moving for loading and unloading a scrub pad and only the robotic assembly 234 needs to move for such loading and unloading. Each of the scrub pads 216A-216G can be similar to the scrub pad 300 previously described. More details of the apparatus 200 can also be found in the previously referenced and incorporated application Ser. No. 11/195,926.

It is to be appreciated that the apparatus 100 may also be configured to include a similar loading/unloading station to the station 230 although it is not shown in FIG. 1. Additionally, although apparatuses 100 and 200 are described, it is to be understood that embodiments of the present invention can be similarly applied to other probe systems.

Figure 5:
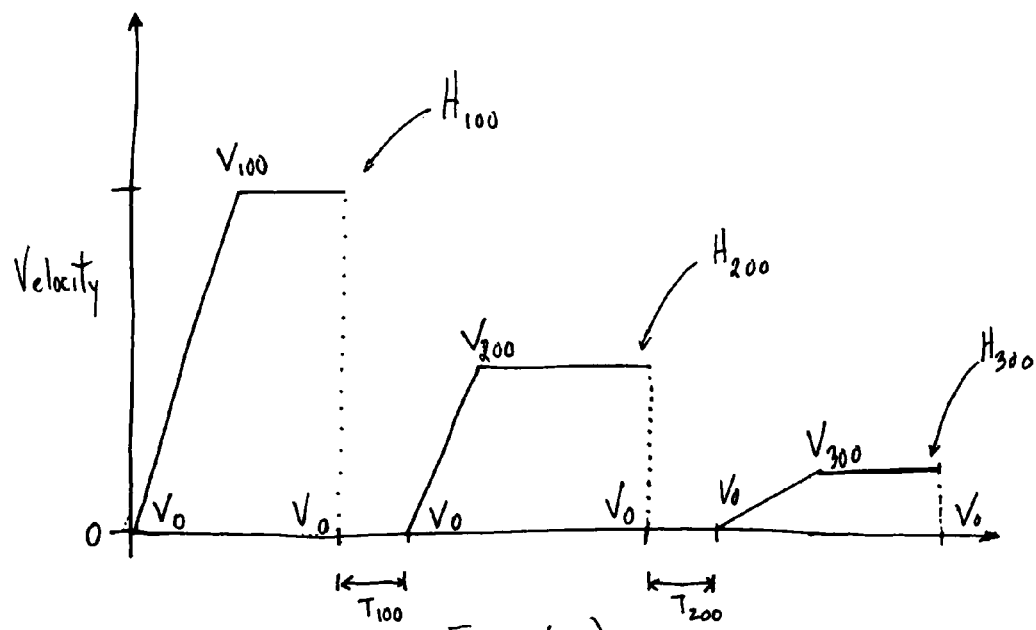
FIGS. 5-6 illustrate a motion profile of moving a substrate to contact a probe card.
Figure 6:
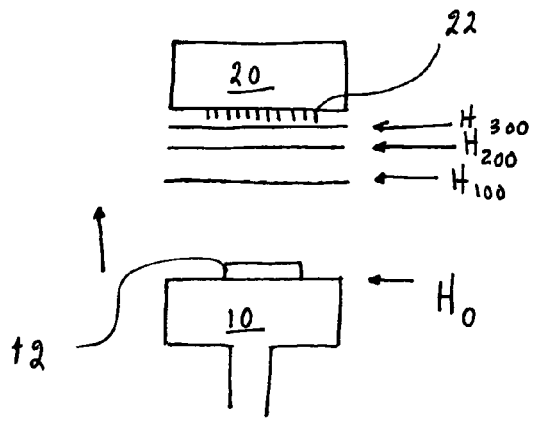

FIGS. 5-6 illustrate exemplary motion profiles used by current methods to move a substrate closer to a probe card for a particular procedure or testing. To avoid damages to the probe card, probe pins, substrate, devices on the substrate, and/or other elements of the probe card and substrate, motion parameters used to move the substrate closer to the probe card are adjusted and changed to achieve a softer contact. Current methods include moving the substrate up to specific heights of contact but not physical contact and change the motion parameter (slower velocity) and continue moving further up toward the height with the reduced motion parameter and move down in the reverse sequences. As illustrated in FIGS. 5-6, over a course of time (T) for moving a substrate 12 loaded on a substrate chuck 10 to a probe card 20 having probe pins 22, several velocities are employed. Initially, the substrate 12 begins with an initial velocity of zero, $V_0$ and at a height $H_0$. The substrate 12 is moved to a height $H_{100}$ with a fast velocity or full speed $V_{100}$, then is stopped for a duration of $T_{100}$. During the time $T_{100}$, the velocity is adjusted. The velocity is also dropped to zero, $V_0$, during the time $T_{100}$. The motion for the substrate 12 is then changed to a new velocity parameter $V_{200}$, which is slower than the $V_{100}$. The substrate 12 moves up to a second height $H_{200}$ from the first height $H_{100}$ at the velocity $V_{200}$. The substrate 12 is then again stopped for a duration of $T_{200}$. During the time $T_{200}$, the velocity is adjusted. The velocity is dropped to zero, $V_0$, during the time $T_{200}$. The motion for the substrate 12 is then changed to yet another new velocity parameter $V_{300}$, which is slower than the $V_{100}$ and $V_{200}$. The velocity $V_{300}$ should be one that will allow the substrate 12 to touch the probe card 20 with a soft touch to prevent damages. The substrate 12 moves a third height $H_{300}$ from the height $H_{200}$ at the velocity $V_{300}$ where the probe pins 22 can contact certain necessary components on the substrate 12 for a particular procedure. The current methods suffer a substantial impact on the motion time, which impacts the system's throughput due to the stopping, adjusting, and resetting velocity at one or more intermediate heights and moving to the final height.

Embodiments of the present invention describe a method to move a substrate and a probe card closer to each other with a microtouch impact (soft, smooth, and controlled touch without potentially causing bending or other kind of damages to components) and with motions that are varied "on the fly" without the need to move to a specific height, stop, and change velocity. Motions are varied on the fly when the motions are changing form one velocity to another velocity without a stop or without using a velocity of zero. The velocities (or accelerations) of the moving components are thus dynamically changing (changing continuously) and until the final position (impact) is achieved, the velocity is not at zero. The velocities or the motion parameters for moving a substrate and a probe card closer to each other are configured using continuously changing (dynamically changing) motions. For a particular substrate and probe card, information such as thickness, materials, and density characteristics are obtained and used to configure a particular motion profile. The motion profile includes a sequence of velocities that will be used to move such substrate and probe card closer and into contact with each other. The motion profile can be programmed into a controller provided to run the probe system, which can then execute the motions profile to bring the substrate and probe card into contact with each other. The methods of moving the substrate and the probe card closer to each other according to the embodiments of the present invention change the rate of force or impact as the substrate contacts the probe card. The motion profile has initial velocities being fast and full speed and reduced on the fly to slower velocities and slower velocities for impact. Such motion profile reduces the impact with which the probe elements initially contact the substrate elements without sacrificing throughput.

In one embodiment, the substrate is moved toward a stationary probe card with a full (fast) speed and the velocity of the moving substrate is changed or reduced so that the substrate approaches the probe card slower to allow the microtouch impact. The velocities are constantly monitored and changed according to the position of the substrate relative to the probe card. It is to be understood that in other embodiments, the substrate may be stationary instead and the probe card moves toward the substrate with similar constantly monitored and changing velocities.

In one embodiment, the positions of the probe card supporter and the substrate supporter in a probe system are determined so that the velocities can be continuously monitored and changed as the probe card and the substrate are brought closer to one another. The initial and desired final positions and positions during moving are also monitored or determined. For instance, with respect to the apparatus 100 or 200, the initial positions for the probe card (130 or 230) and the substrate (112 or 208) are determined so that when the substrate is moved up to the probe card (or the probe card moving down to the substrate) the sequence of velocities for the moving can be configured, implemented, and the velocities are monitored and varied continuously to provide the microtouch impact. The velocities of the motions for moving the probe card or the substrate (or the probe card) from an initial location to a final location for a microtouch impact between the substrate and the probe card are continuously monitored and changed until the desired impact is achieved.

In one embodiment, a probe card and a substrate are moved vertically closer to one another using continuous or dynamically changing velocities from fast to slow to prevent excessive force on impact. The velocities are changing as the probe card and/or the substrate is moving so that the velocities are only at zero at an initial location (probe card and substrate apart) and a final location (probe card and substrate contact each other). The velocities for the moving may be updated frequently, such as at least every 40-60 microseconds. The duration of the updates depends on the locations (initial and final) of the substrate and the probe card.

Figure 7A:
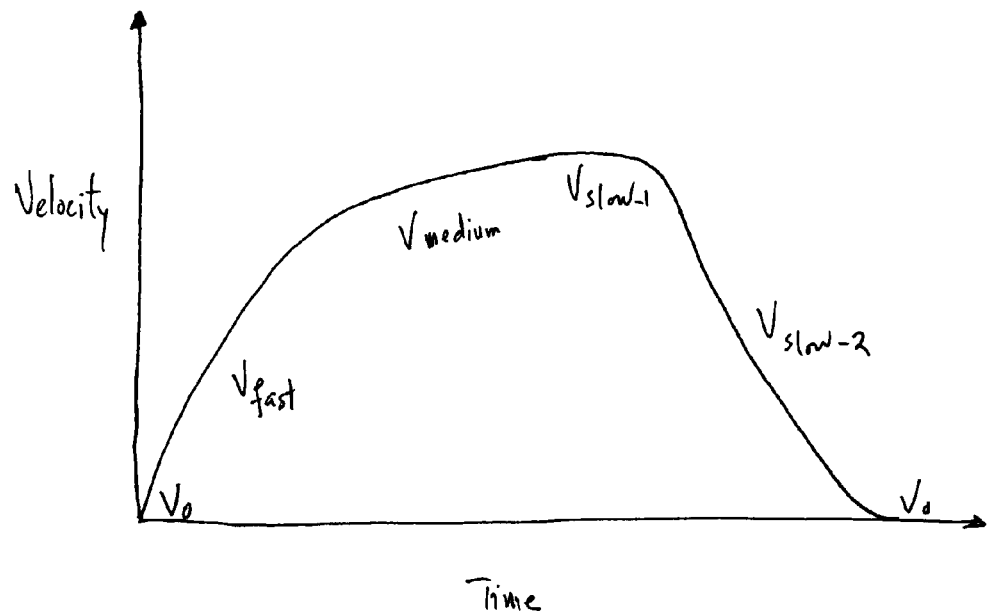
FIGS. 7A-7C illustrate exemplary motion profiles that can be used to move a substrate and a probe card closer to contact one another with a microtouch impact.
Figure 7B:
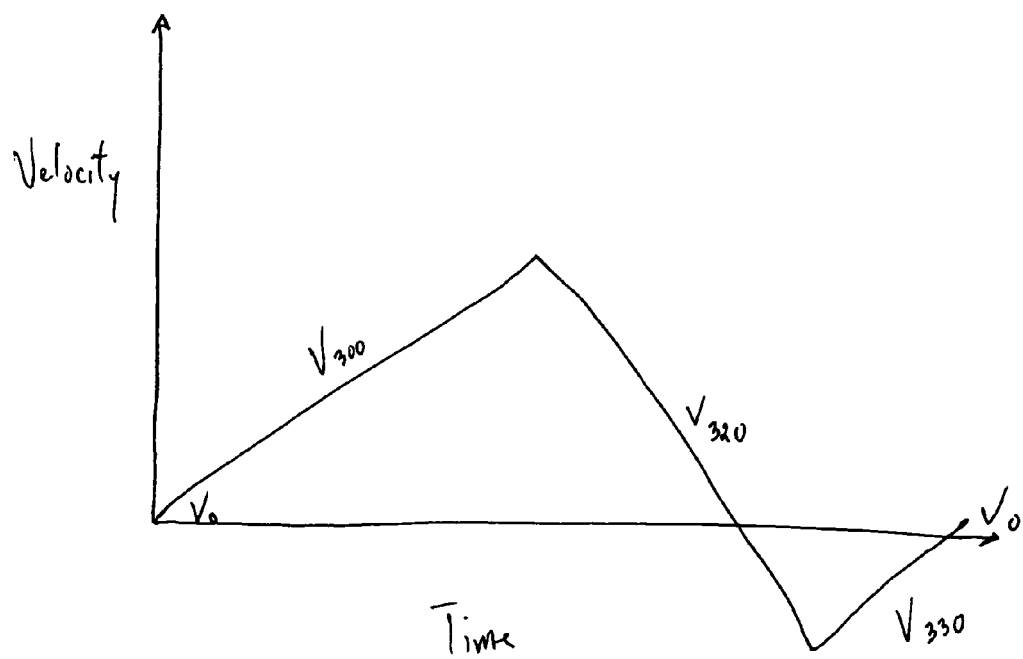
Figure 7C:
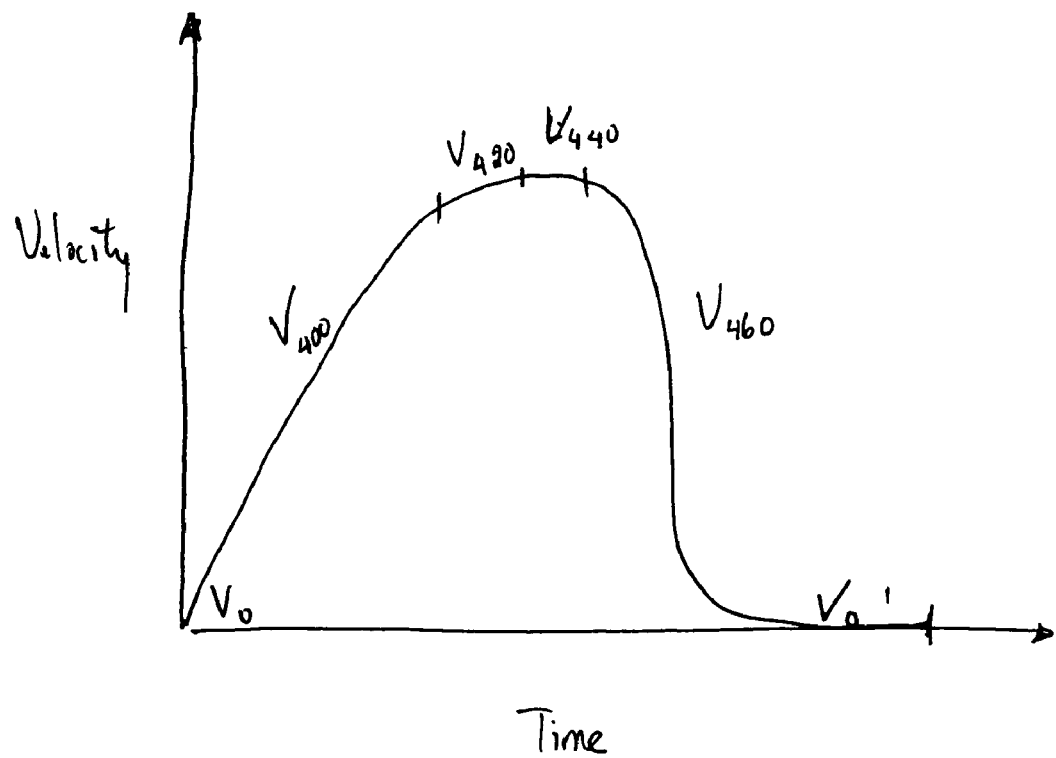

FIGS. 7A-7C illustrate exemplary motion profiles that can be implemented into a probe system to move a substrate and a probe card into contact with one another with a microtouch impact. In FIG. 7A, the velocity begin from $V_0$ and increases to $V_{fast}$ to begin moving either the substrate toward the probe card, the probe card toward the substrate, or both the probe card and substrate toward one another. Under $V_{fast}$, the probe card and substrate are not yet at the locations to contact each other. To decrease the impact force, the velocity decreases from $V_{fast}$ to $V_{medium}$, and decreases further to $V_{slow1}$ and $V_{slow2}$ until $V_0$, which is the point where a contact occurs. Until the contact point, the velocity of the moving component is not at zero. Although not show, a similar motion profile can be used to bring the substrate and/or the probe card back to their initial location. Additionally, it may be that only one velocity is needed to bring the components back to their initial location after the contact and a particular procedure or testing. The actual values of the velocities may vary depending on information of the probe system, the initial locations, the desired final locations, and other characteristics of the probe card and the substrate. Such information is taken into account when the sequence of velocities is being configured for the moving. As mentioned, the sequence of velocities can be programmed into the probe system in order to execute the moving.

In FIG. 7B, the velocity begin from $V_0$ and increases to $V_{300}$ to begin moving either the substrate toward the probe card, the probe card toward the substrate, or both the probe card and substrate toward one another. The velocity $V_{300}$ is typically a fast speed used to move the probe card and substrate toward one another but not to allowed them contact each other. To decrease the impact force, the velocity changes (decreases) from $V_{300}$ to $V_{320}$, and adjusts further to $V_{330}$ until $V_0$, which is the point where a contact occurs. Until the contact point, the velocity of the moving component is not at zero. As before, a similar motion profile can be used to bring the substrate and/or the probe card back to their initial location. Additionally, it may be that only one velocity is needed to bring the components back to their initial location after the contact and a particular procedure or testing. The actual values of the velocities may vary depending on information of the probe system, the initial locations, the desired final locations, and other characteristics of the probe card and the substrate. Such information is taken into account when the sequence of velocities is being configured for the moving. As mentioned, the sequence of velocities can be programmed into the probe system in order to execute the moving.

In FIG. 7C, the velocity begin from $V_0$, increases to $V_{400}$, increases further to $V_{420}$, and changes to $V_{440}$ to begin moving either the substrate toward the probe card, the probe card toward the substrate, or both the probe card and substrate toward one another. Under $V_{400}$-$V_{440}$, the probe card and substrate are not yet at the locations to contact each other. To decrease the impact force, the velocity decreases from $V_{440}$ to $V_{460}$, and may decrease further until $V_0$, which is the point where a contact occurs. Until the contact point, the velocity of the moving component is not at zero. As before, a similar motion profile can be used to bring the substrate and/or the probe card back to their initial location. Additionally, it may be that only one velocity is needed to bring the components back to their initial location after the contact and a particular procedure or testing. The actual values of the velocities may vary depending on information of the probe system, the initial locations, the desired final locations, and other characteristics of the probe card and the substrate. Such information is taken into account when the sequence of velocities is being configured for the moving. As mentioned, the sequence of velocities can be programmed into the probe system in order to execute the moving.

Figure 8:
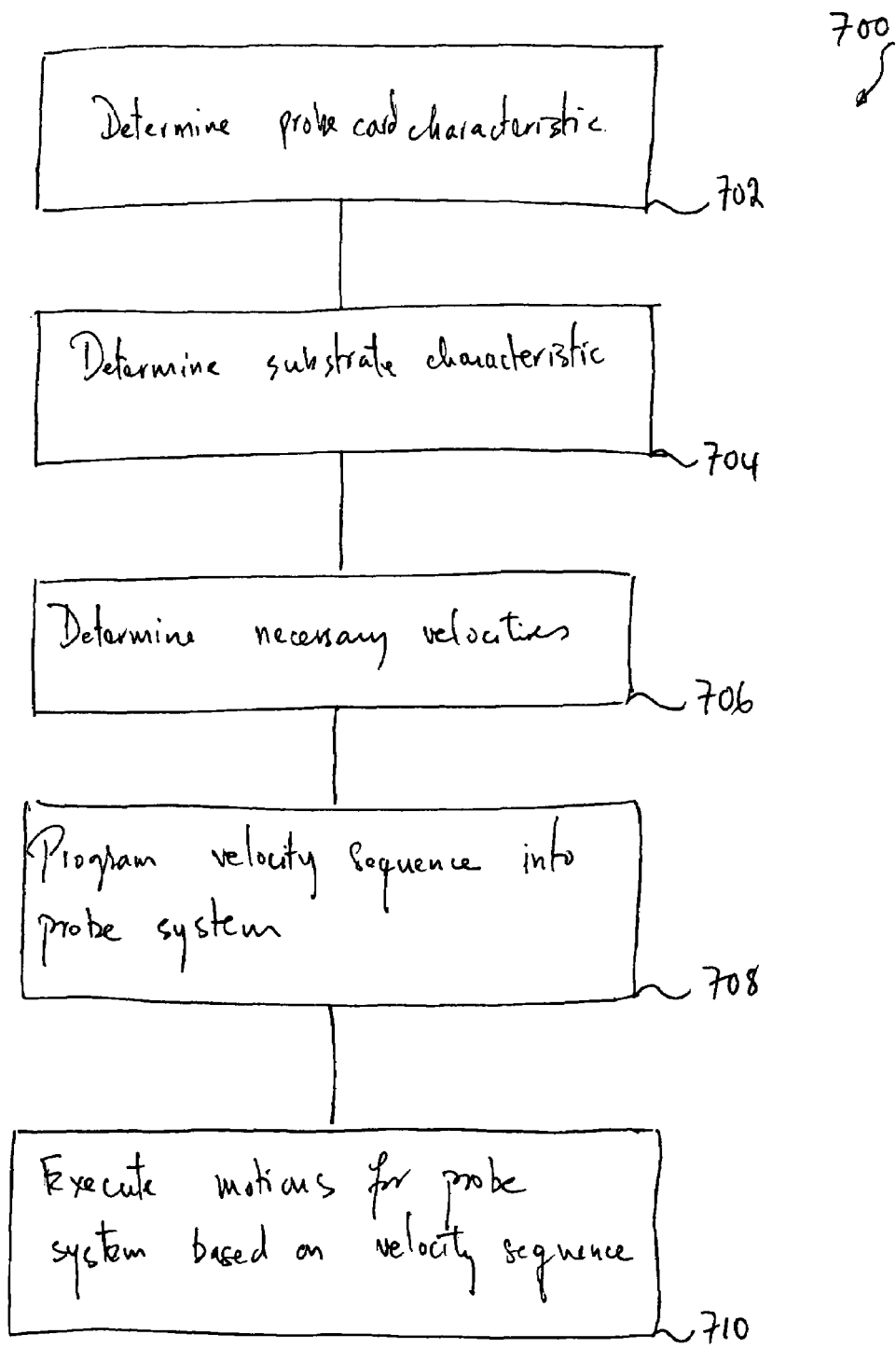
FIG. 8 illustrates an exemplary method of moving a probe card and a substrate closer to one another according to some embodiments of the present invention.

FIG. 8 illustrates an exemplary method 700 of moving a probe card and substrate closer to one another to create a microtouch impact for a particular testing. At 702, a probe card's characteristic(s) are determined. The probe card characteristics include at least the probe card material, thickness, composition, length of the probe pins that will penetrate a layer on a substrate, thickness of the probe pins, and location of the probe card in a probe system. The probe card characteristics constitute one or more attributes that are considered in configuring a sequence of velocities for moving the probe card and substrate into contact. At 704, a substrate's characteristic(s) are determined. The substrate characteristics include at least the substrate material, thickness, composition, length and/or width of the substrate's contact pads, thickness of the contact pads, thickness and material of a layer that the probe pins can penetrate, material and thickness of a layer that cannot be disturbed, and location of the substrate in a probe system. The initial locations and desired final locations of the probe card, the substrate, as well as the supporters for the probe card and the substrate are also determined so as to determine the sequence of velocities to move the probe card and the substrate into contact.

An auto alignment system and/or a visualization system may be provided in a probe system to facilitate the determination of the location or position of the probe card and the substrate relative to one another. For instance, the visualization or the alignment system may be configured to locate a known position on the substrate relative to a known position on a motor used to move the substrate supporter in order to control the motions of the substrate supporter thus, the position of the substrate. The probe system is configured to align the probe card to the substrate in a way to align the probe pins to the contact pads on the substrate. The probe system is programmed to know the contact height of the probe card relative to the substrate. The alignment can be controlled by a controller provided for the probe card system as is known in the art.

At 706 and 708, the necessary velocities and sequence of velocities are determined (706) and programmed into the probe system (708) so that the probe card and the substrate can be moved toward each other to a final microtouch impact. The velocities used to move the probe card and the substrate toward each other are constantly monitored and changed on the fly. During the moving, the velocity does not remain at zero. In one embodiment, a sequence of velocities are predetermined based on the characteristics of the probe card and the substrate. The velocities are selected so that either the probe card is moved toward a static substrate or a substrate is moved toward a static probe card with various different velocities. In one embodiment, at the initial take off, the probe card is moved (via the probe card supporter) toward the static substrate (loaded on the substrate supporter) beginning with a full speed/fast velocity, then the motion is modified depending on how far the probe card is to the substrate. The velocity is then reduced to a slower velocity but not reduced to a zero velocity so that when the probe card comes into contact with the substrate, the impact is soft and smooth to create a microtouch impact. Only when the impact occurs is the velocity at zero. At 710, the instructions are execute to carry out the motions for the probe system to move the probe card and the substrate into contact. The velocity sequence is then used to dictate the moving so that the contact is a microtouch impact.

In one embodiment, a processing unit or a controller (e.g., controller 120 or 221, FIGS. 1-2) is configured to execute a set of instructions that can carry out the moving with a pre-selected sequence of velocities.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

What is claimed:

1. A method for probing, comprising:
    determining, for use in a probing system, a first characteristic associated with a substrate loaded on a substrate supporter;
    determining, for use in the probing system, a second characteristic associated with a probe card loaded on a probe card supporter;
    determining, for use in the probing system, a set of velocities for moving at least one of said substrate supporter and said probe card supporter relative to each other based on said first characteristic and said second characteristic to cause a contact between said probe card and said substrate, said velocities including one or more fast velocities and one or more slower velocities with respect to said fast velocities, said velocities allowing a fast moving of at least one of said probe card and said substrate relative to each other and a slow moving for a microtouch impact between said probe card and said substrate, wherein the slow moving occurs before any impact; and
    executing motions to carry out said moving.

2. The method of claim 1 further comprising:
    executing motions to move said substrate supporter in a Z-direction toward said probe card supporter.

3. The method of claim 1 further comprising:
    executing motions to move said probe card supporter in a Z-direction toward said substrate supporter.

4. The method of claim 1 wherein said velocities for moving said substrate supporter and said probe card supporter are at zero only at an initial location and at a final location of said substrate supporter and said probe card supporter.

5. The method of claim 1 further comprising:
    changing said velocities at least two times during a course of moving said substrate supporter and said probe card supporter.

6. The method of claim 1 further comprising:
    regulating said velocities continuously and modifying said velocities continuously to control said microtouch impact.

7. The method of claim 1 further comprising:
    returning said substrate supporter and said probe card to an initial location after said microtouch impact.

8. The method of claim 7 wherein returning said substrate supporter and said probe card to the initial location is done using a fast velocity.

9. A computer readable medium containing executable program instructions which cause a system to perform a method for probing, comprising:
    determining, for use in the probing system, a first characteristic associated with a substrate loaded on a substrate supporter;
    determining, for use in the probing system, a second characteristic associated with a probe card loaded on a probe card supporter;
    determining, for use in the probing system, a set of velocities for moving at least one of said substrate supporter and said probe card supporter relative to each other based on said first characteristic and said second characteristic to cause a contact between said probe card and said substrate, said velocities including one or more fast velocities and one or more slower velocities with respect to said fast velocities, said velocities allowing a fast moving of at least one of said probe card and said substrate relative to each other and a slow moving for a microtouch impact between said probe card and said substrate, wherein the slow moving occurs before any impact; and
    executing motions to carry out said moving.

10. A medium of claim 9, wherein the method further comprises:
    executing motions to move said substrate supporter in a Z-direction toward said probe card supporter.

11. A medium of claim 9, wherein the method further comprises:
    executing motions to move said probe card supporter in a Z-direction toward said substrate supporter.

12. A medium of claim 9, wherein said velocities for moving said substrate supporter and said probe card supporter are a zero only at an initial location and at a final location of said substrate supporter and said probe card supporter.

13. A medium of claim 9, wherein the method further comprises:
    changing said velocities at least two times during a course of moving said substrate supporter and said probe card supporter.

14. A medium of claim 9, wherein the method further comprises:
    regulating said velocities continuously and modifying said velocities continuously to control said microtouch impact.

15. A medium of claim 9, wherein the method further comprises:
    returning said substrate supporter and said probe card to an initial location after said microtouch impact.

16. A medium of claim 15, wherein returning said substrate supporter and said probe card to the initial location is done using a fast velocity.

* * * * *